US009640281B1

(12) United States Patent
Seo et al.

(10) Patent No.: US 9,640,281 B1
(45) Date of Patent: May 2, 2017

(54) MEMORY SYSTEM AND OPERATING METHOD THEREOF

(71) Applicant: SK hynix Inc., Gyeonggi-do (KR)

(72) Inventors: Yoon-Seong Seo, Gyeonggi-do (KR); Won-Jin Jung, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/250,826

(22) Filed: Aug. 29, 2016

(30) Foreign Application Priority Data

Mar. 28, 2016 (KR) ........................ 10-2016-0036698

(51) Int. Cl.

| | |
|---|---|
| ***G11C 16/16*** | (2006.01) |
| ***G11C 29/44*** | (2006.01) |
| ***G06F 3/06*** | (2006.01) |
| ***G11C 16/10*** | (2006.01) |
| ***G11C 16/26*** | (2006.01) |

(52) U.S. Cl.

CPC ............ *G11C 29/44* (2013.01); *G06F 3/0604* (2013.01); *G06F 3/064* (2013.01); *G06F 3/0659* (2013.01); *G06F 3/0679* (2013.01); *G11C 16/10* (2013.01); *G11C 16/26* (2013.01)

(58) Field of Classification Search

CPC ................................ G11C 16/10; G11C 16/16

USPC ........................................ 365/185.09, 185.24

See application file for complete search history.

(56) References Cited

U.S. PATENT DOCUMENTS

2009/0310408 A1* 12/2009 Lee ...................... G11C 11/5628 365/185.03
2010/0313084 A1* 12/2010 Hida ................... G06F 11/1068 714/704
2012/0284453 A1* 11/2012 Hashimoto ........... G06F 3/0616 711/103
2013/0148435 A1* 6/2013 Matsunaga ........ G11C 16/3404 365/185.23
2014/0215122 A1* 7/2014 Li ....................... G06F 11/1666 711/103
2014/0325294 A1* 10/2014 Chan ..................... G06F 11/076 714/708
2015/0242143 A1* 8/2015 Kim ...................... G06F 3/0619 714/704
2015/0301932 A1* 10/2015 Oh .......................... G06F 11/00 711/102
2015/0339188 A1* 11/2015 Hu ...................... G06F 11/1072 714/704

(Continued)

FOREIGN PATENT DOCUMENTS

KR 1020080069389 7/2008
KR 1020130045495 5/2013

*Primary Examiner* — Michael Tran

(74) *Attorney, Agent, or Firm* — I P & T Group LLP

(57) ABSTRACT

A memory system includes: a memory device including a plurality of blocks each block including a plurality of pages, suitable for performing an operation in response to a command and an address; and a controller suitable for determining whether a block in which a read fail has occurred is an open block including an unprogrammed page, performing a restoration operation for the unprogrammed page of the open block based on at least one of operation temperature information and a read count, when it is determined that the block in which the read fail has occurred is the open block, and generating the command for performing a read retry operation.

19 Claims, 14 Drawing Sheets

(56) References Cited

U.S. PATENT DOCUMENTS

2016/0104539 A1* 4/2016 Kim ....................... G11C 16/28
365/185.12
2016/0292025 A1* 10/2016 Gupta ................... G06F 11/076
2016/0350179 A1* 12/2016 Lin ..................... G06F 11/1068

* cited by examiner

BLKi
BL1
BL2
BL3
SSL1
SSL2
SSL3
WL6
WL5
WL4
DWL
WL3
WL2
WL1
GSL
CSL
NS11
NS21
NS31
NS12
NS22
NS32
NS13
NS23
NS33
SST
MC6
MC5
MC4
DMC
MC3
MC2
MC1
GST

MEMORY SYSTEM AND OPERATING METHOD THEREOF

CROSS-REFERENCE TO RELATED APPLICATION

This application claims priority under 35 U.S.C. §119(a) to Korean Patent Application No. 10-2016-0036698, filed on Mar. 28, 2016 in the Korean Intellectual Property Office, the disclosure of which is incorporated herein by reference in its entirety.

TECHNICAL FIELD

Exemplary embodiments of the present invention relate generally to a semiconductor design technology and, more particularly, to a read operation of a memory system.

DISCUSSION OF THE RELATED ART

The computer environment paradigm has shifted to ubiquitous computing systems that can be used anytime and anywhere. Due to this fact, use of portable electronic devices such as mobile phones, digital cameras, and notebook computers has rapidly increased. These portable electronic devices generally use a memory system having memory devices for storing data, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Various embodiments are directed to a memory system and an operating method thereof capable of separating, when a read fail occurs, an open block and a closed block provided in a memory device and performing a retry operation.

In an embodiment, a memory system may include: a memory device including a plurality of blocks each block including a plurality of pages, suitable for performing an operation in response to a command and an address; and a controller suitable for determining whether a block in which a read fail has occurred is an open block including an unprogrammed page, performing a restoration operation for the unprogrammed page of the open block based on at least one of operation temperature information and a read count, when it is determined that the block in which the read fail has occurred is the open block, and generating the command for performing a read retry operation.

In an embodiment, an operating method of a memory system including: a memory device provided with a memory cell array including a plurality of blocks each of which includes a plurality of pages; and a controller suitable for generating a command and an address to control operation of the memory device, may include: detecting error bits included in data read out from the memory device during a read operation of the memory device; indicating a read fail when the number of detected error bits is greater than or equal to a correctable error bit threshold value; determining, when the read fail occurs, whether a block in which the read fail has occurred is an open block including an unprogrammed page; performing, if it is determined that the block in which the read fail has occurred is the open block including the unprogrammed page, a restoration operation for the unprogrammed page, based on at least one of operation temperature information and a read count; and performing a read retry operation.

In an embodiment, an operating method of a memory system including: a memory device provided with a memory cell array including a plurality of blocks each of which includes a plurality of pages; and a controller suitable for generating a command and an address to control operation of the memory device, may include: detecting error bits included in data read out from the memory device during a read operation of the memory device; indicating a read fail when the number of detected error bits is greater than or equal to a correctable error bit threshold value; performing a read retry operation when the read fail occurs; determining whether a block in which the read fail has occurred is an open block including an unprogrammed page; performing, if it is determined that the block in which the read fail has occurred is the open block including the unprogrammed page, a restoration operation for the unprogrammed page, based on at least one of operation temperature information and a read count; and performing a read retry operation for the open block on which the restoration operation has been performed.

According to the embodiments, when a read fail occurs in a memory system, a read retry operation is performed after an open block of a memory device is converted into a closed block through a restoration algorithm. Therefore, a read fail which is caused when a read voltage is applied to the open block in the same manner as that of the closed block can be prevented, and the reliability of the memory system can be enhanced.

DETAILED DESCRIPTION

Figure 1:
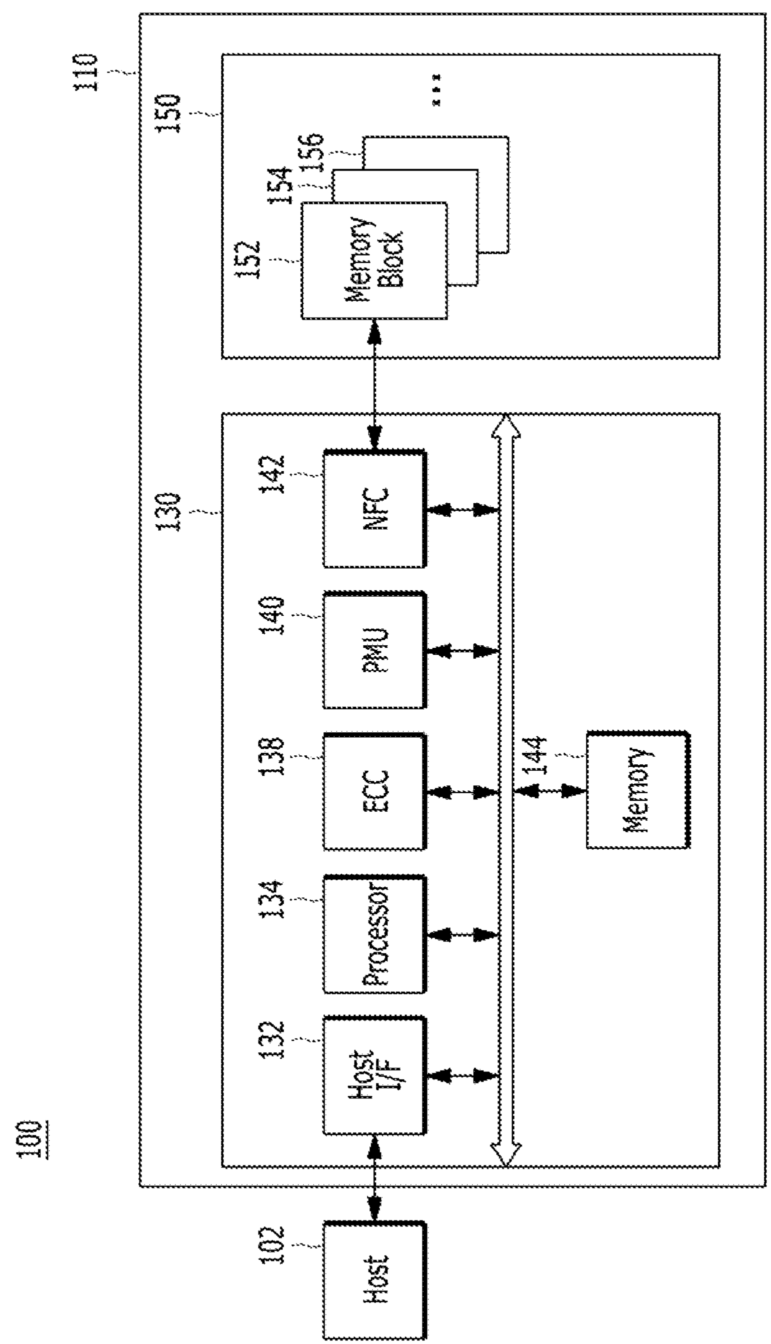
FIG. 1 is a diagram illustrating a data processing system including a memory system, according to an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and the like may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "Including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 illustrates a data processing system 100, according to an embodiment of the present invention.

Referring to FIG. 1, the data processing system 100 may include a host 102 and a memory system 110.

The host 102 may include a portable electronic device, such as a mobile phone, an MP3 player and a laptop computer or a non-portable electronic device, for example, a desktop computer, a game player, a television (TV) and a projector.

The memory system 110 may operate in response to a request from the host 102. The memory system 110 may, for example, store data to be accessed by the host 102. The memory system 110 may be used as a main memory system or an auxiliary memory system of the host 102. The memory system 110 may be implemented with any one of various storage devices, according to the protocol of a host interface to be coupled electrically with the host 102. The memory system 110 may be implemented with any one of various storage devices, for example, a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, for example, a dynamic random access memory (DRAM) and a static random access memory (SRAM), or a nonvolatile memory device, for example, a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 for storing data to be accessed by the host 102, and a controller 130 for controlling the storage of data in the memory device 150.

The controller 130 and the memory device 150 may be integrated into one semiconductor device. For instance, the controller 130 and the memory device 150 may be integrated into one semiconductor device configured as a solid state drive (SSD). When the memory system 110 is used as the SSD, the operation speed of the host 102 that is coupled electrically with the memory system 110 may be increased significantly.

The controller 130 and the memory device 150 may be integrated into one semiconductor device configured as a memory card, for example, a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted. The memory device 150 may store the data provided from the host 102 during a write operation. The memory device 150 may provide stored data to the host 102 during a read operation.

The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are coupled electrically. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 in the memory device 150. To this end, the controller 130 may control the overall operations of the memory device 150, for example, read, write, program and erase operations.

For example, according to the embodiment of FIG. 1, the controller 130 may include a host interface unit 132, a processor 134, an error correction code (ECC) unit 138, a power management unit (PMU) 140, a NAND flash controller (NFC) 142, and a memory 144.

The host interface unit 132 may process commands and data provided from the host 102, and may communicate with the host 102 through at least one of various interface protocols, for example, universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation, for example, a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and the like. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. For example, the NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with a volatile memory. For example, the memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and the like.

The processor 134 may the control general operations of the memory system 110. The processor 134 may control a write operation or a read operation for the memory device 150, in response to a write or a read request received from the host 102. The processor 134 may drive firmware, also referred to as a flash translation layer (FTL), to control the general operations of the memory system 110. For example, the processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory (e.g., a NAND flash memory), a program failure may occur during the write operation (or program operation), due to characteristics of a NAND logic function. During bad block management, the data of the program-failed memory block or the bad memory block may be programmed into a new memory block. Also, the bad blocks due to a program fail seriously deteriorate the utilization efficiency of the memory device 150 having a 3D stack structure and the reliability of the memory system 100, hence, reliable bad block management is required.

Figure 2:
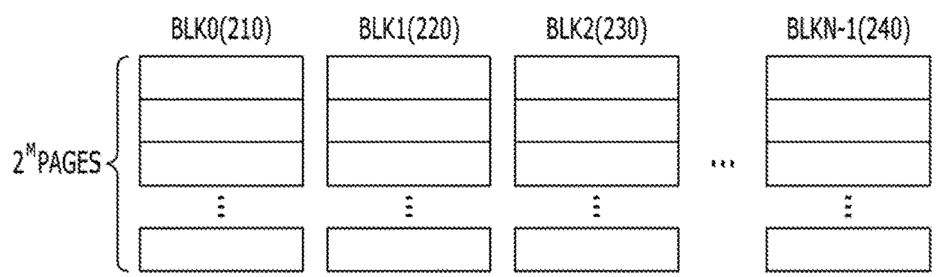
FIG. 2 is a diagram illustrating a memory device employed in the memory system shown in FIG. 1, according to an embodiment of the present invention.

FIG. 2 is a schematic diagram illustrating the memory device 150 shown in FIG. 1, according to an embodiment of the Invention.

Referring to FIG. 2, the memory device 150 may include a plurality of memory blocks. For example, the memory device 150 may include zeroth to $(N-1)^{th}$ blocks 210 to 240. Each of the plurality of memory blocks 210 to 240 may include a plurality of pages. For example, each of the plurality of memory blocks 210 to 240 may include $2^M$ number of pages ($2^M$ PAGES). The number of memory blocks and pages may vary based on design. Each of the plurality of pages may include a plurality of memory cells to which a plurality of word lines are coupled electrically.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data (e.g., two or more-bit data). An MLC memory block including a plurality of pages which are implemented with memory cells each capable of storing 3-bit data is also referred to as a triple level cell (TLC) memory block.

Each of the plurality of memory blocks 210 to 240 may store the data provided from the host 102 during a write operation. Each of the plurality of memory blocks 210 to 240 may provide stored data to the host 102 during a read operation.

Figure 3:
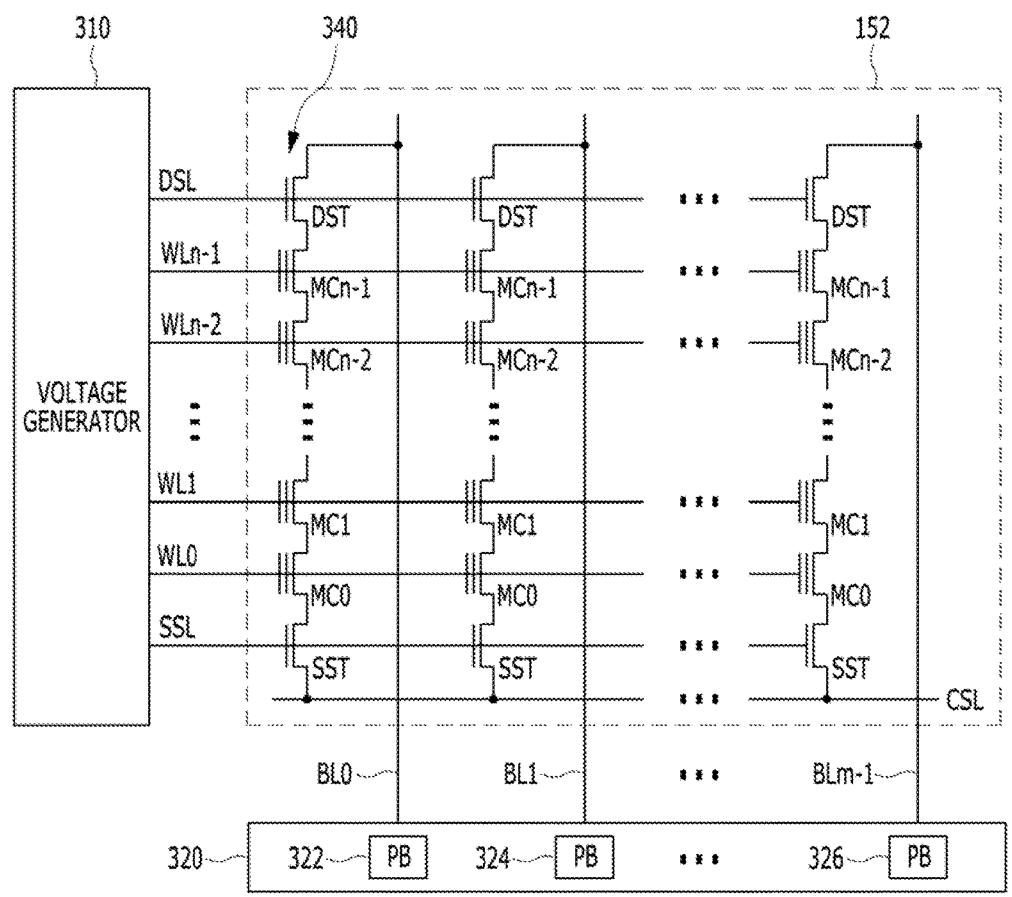
FIG. 3 is a circuit diagram illustrating a memory block in a memory device, according to an embodiment of the present invention.

FIG. 3 is a circuit diagram illustrating one of the plurality of memory blocks 152 to 156 shown in FIG. 1, according to an embodiment of the present invention.

Referring to FIG. 3, the memory block 152 of the memory device 150 may include a plurality of cell strings 340 which are coupled electrically to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be coupled electrically in series between the select transistors DST and SST. The respective memory cells MC0 to MCn−1 may be configured by multi-level cells (MLC) each of which stores data information of a plurality of bits. The strings 340 may be coupled electrically to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 according to the embodiment is not limited to NAND flash memory cells and may be implemented with NOR flash memory cells, hybrid flash memory cells in which at least two kinds of memory cells are combined, or one-NAND flash memory cells in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage generator 310 of the memory device 150 may provide word line voltages such as a program voltage, a read voltage and a pass voltage, to be supplied to respective word lines according to an operation mode and voltages to be supplied to bulks, for example, well regions in which the memory cells are formed. The voltage generator 310 may perform a voltage generating operation under the control of a control circuit (not shown). The voltage generator 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by a control circuit (not shown), and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

FIGS. 4 to 11 are diagrams illustrating the memory device 150 shown in FIG. 1.

Figure 4:
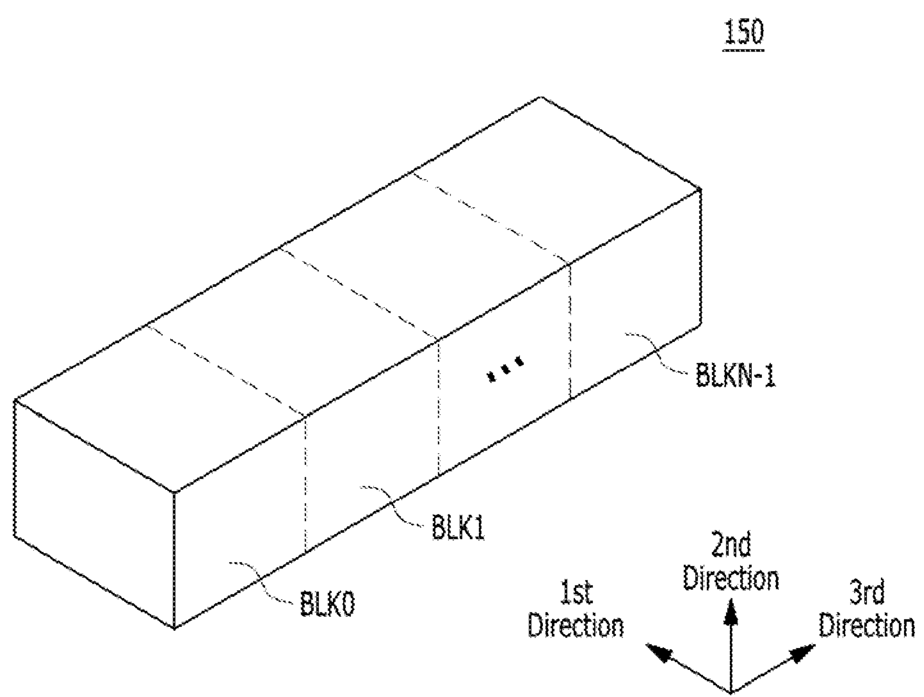
FIGS. 4 to 11 are diagrams illustrating various aspects of the memory device shown in FIG. 2.

FIG. 4 is a block diagram illustrating an example of the plurality of memory blocks included in the memory device 150 shown in FIG. 1.

Referring to FIG. 4, the memory device 150 may include a plurality of memory blocks BLK0 to BLKN−1, and each of the memory blocks BLK0 to BLKN−1 may be realized in a three-dimensional (3D) structure or a vertical structure. The respective memory blocks BLK0 to BLKN−1 may include structures which extend in first to third directions (e.g., an x-axis direction, a y-axis direction and a z-axis direction).

The respective memory blocks BLK0 to BLKN−1 may include a plurality of NAND strings NS which extend in the second direction. The plurality of NAND strings NS may be provided in the first direction and the third direction. Each NAND string NS may be coupled electrically to a bit line BL, at least one source select line SSL, at least one ground select line GSL, a plurality of word lines WL, at least one dummy word line DWL, and a common source line CSL. Namely, the respective memory blocks BLK0 to BLKN−1 may be coupled electrically to a plurality of bit lines BL, a plurality of source select lines SSL, a plurality of ground select lines GSL, a plurality of word lines WL, a plurality of dummy word lines DWL, and a plurality of common source lines CSL.

Figure 5:
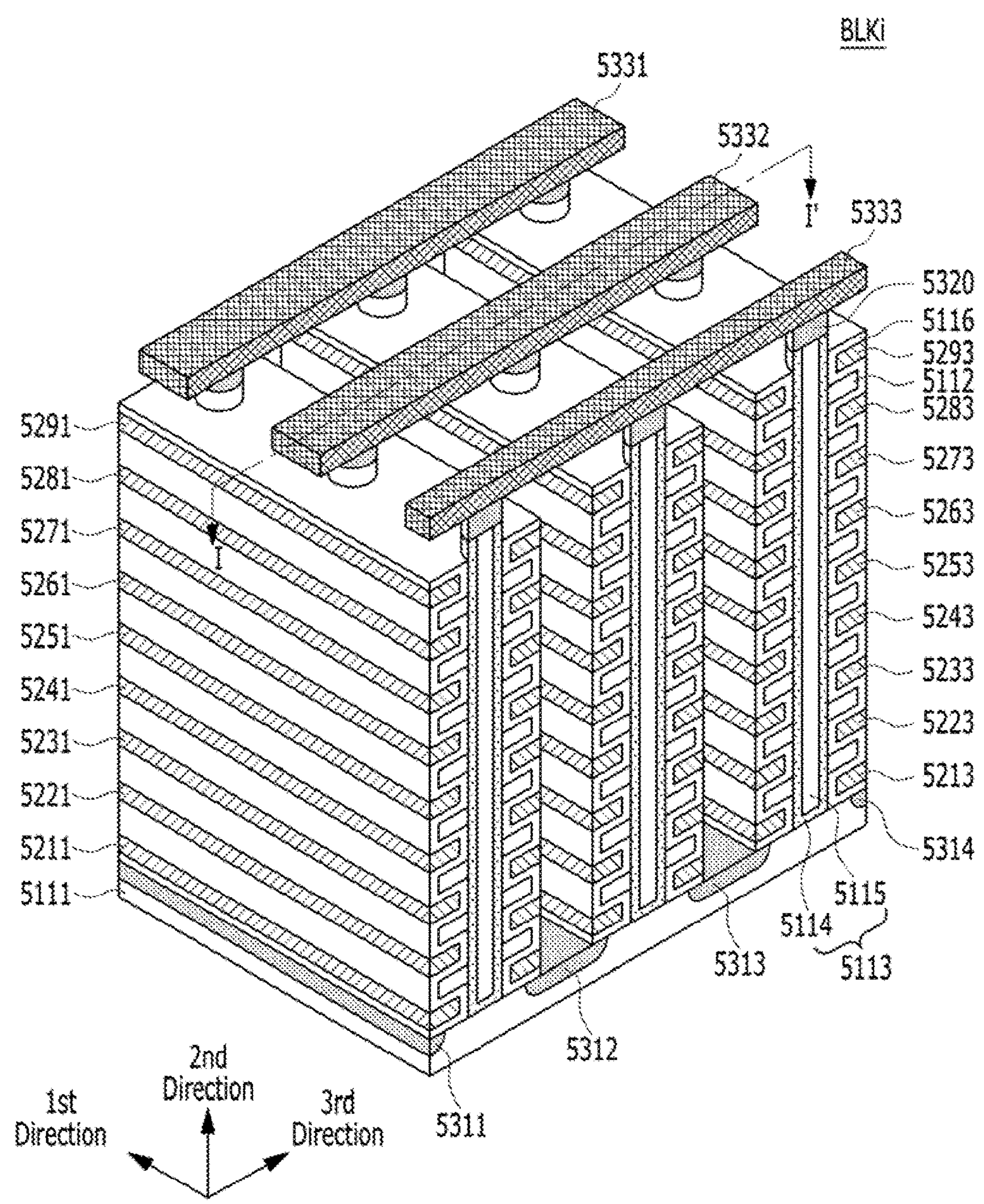
Figure 6:
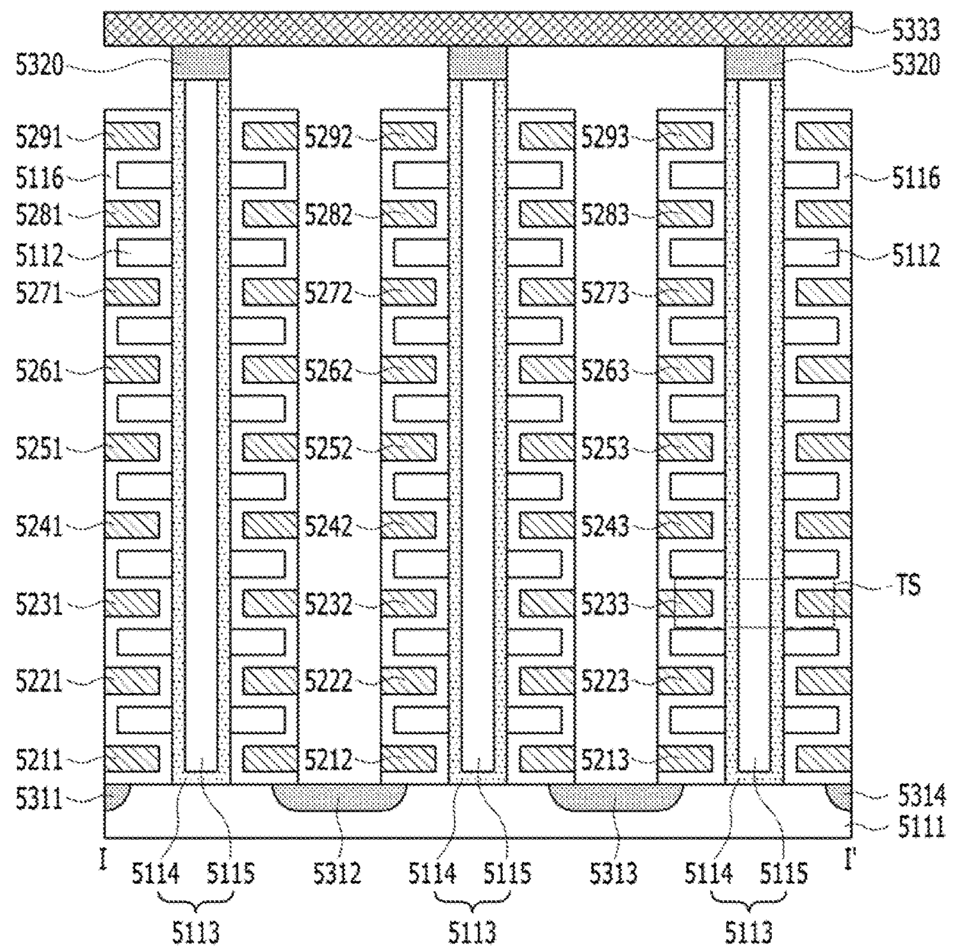

FIG. 5 is a perspective view of one BLKi of the plural memory blocks BLK0 to BLKN−1 shown in FIG. 4. FIG. 6 is a cross-sectional view taken along a line I-I' of the memory block BLKi shown in FIG. 5.

Referring to FIGS. 5 and 6, a memory block BLKi among the plurality of memory blocks of the memory device 150 may include a structure extending in the first to third directions.

A substrate 5111 may be provided. The substrate 5111 may include a silicon material doped with a first type impurity. The substrate 5111 may include a silicon material doped with a p-type impurity or may be a p-type well (e.g., a pocket p-well), and include an n-type well which surrounds the p-type well. While it is assumed that the substrate 5111 is p-type silicon, it is to be noted that the substrate 5111 is not limited to being p-type silicon.

A plurality of doping regions 5311 to 5314 which extend in the first direction may be provided over the substrate 5111. The plurality of doping regions 5311 to 5314 may contain a second type of impurity that is different from the substrate 5111. The plurality of doping regions 5311 to 5314 may be doped with an n-type impurity. While it is assumed here that first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric materials 5112 which extend in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be coupled electrically with the substrate 5111. Each pillar 5113 may be configured by a plurality of materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material, for example, silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 extending in the first direction may be provided between the dielectric material 5112 adjacent to the substrate 5111 and the substrate 5111. In particular, the conductive material 5211 extending in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material extending in the first direction may be provided between (i) the dielectric layer 5116 disposed over the top surface of one of the dielectric materials 5112 and (ii) the dielectric layer 5116 disposed over the bottom surface of another dielectric material of the dielectric materials 5112, which is disposed over the certain dielectric material 5112. The conductive materials 5221 to 5281 which extend in the first direction may be provided between the dielectric materials 5112. The conductive material 5291 extending in the first direction may be provided over the uppermost dielectric material 5112. The conductive materials 5211 to 5291 which extend in the first direction may be a metallic material. The conductive materials 5211 to 5291 which extend in the first direction may be a conductive material, for example, polysillcon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. The drains 5320 may be silicon materials doped with second type impurities. The drains 5320 may be silicon materials doped with n-type impurities. While it is assumed for the sake of convenience that the drains 5320 include n-type silicon, it is to be noted that the drains 5320 are not limited to being n-type silicon. For example, the width of each drain 5320 may be larger than the width of each corresponding pillar 5113. Each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be coupled electrically with the drains 5320 of corresponding regions. The drains 5320 and the conductive materials 5331 to 5333 which extend in the third direction may be coupled electrically with through contact plugs. The conductive materials 5331 to 5333 which extend in the third direction may be a metallic material. The conductive materials 5331 to 5333 which extend in the third direction may be a conductive material, for example, polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. The respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
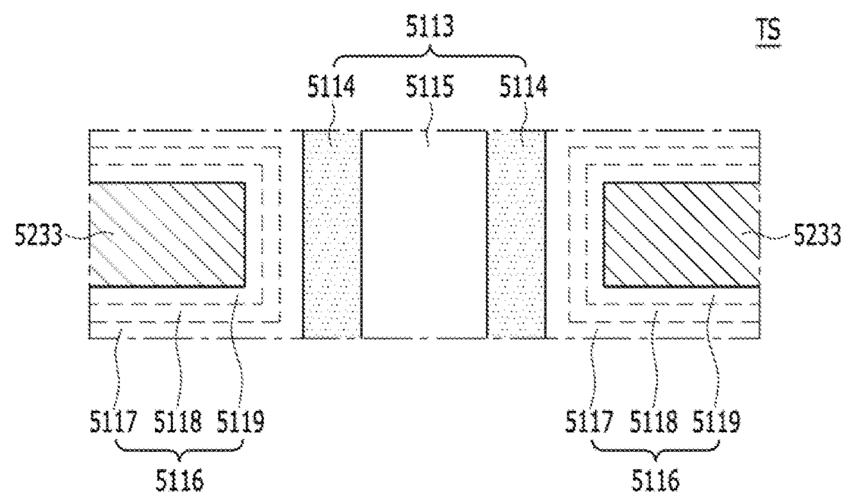

FIG. 7 is a cross-sectional view of the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer, for example, an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 extending in the first direction may be formed as a single layer or multiple layers. The third sub dielectric layer 5119 may be a high-k dielectric layer, for example, an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. In other words, the gates or the control gates may extend in the first direction and form word lines and at least two select lines, at least one source select line SSL and at least one ground select line GSL.

The conductive materials 5331 to 5333 which extend in the third direction may be coupled electrically to one end of the NAND strings NS. The conductive materials 5331 to 5333 which extend in the third direction may serve as bit lines BL. That is, in one memory block BLKi, the plurality of NAND strings NS may be coupled electrically to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Namely, the memory block BLKi may include a plurality of NAND strings NS which extend in a direction perpendicular to the substrate 5111 (e.g., the second direction), and may serve as a NAND flash memory block, for example, of a charge capturing type memory, in which a plurality of NAND strings NS are coupled electrically to one bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or any multiple of layers. In other words, in one NAND string NS, the number of transistors may be 8, 16 or more.

While it is illustrated in FIGS. 5 to 7 that 3 NAND strings NS are coupled electrically to one bit line BL, it is to be noted that the embodiment is not limited to having 3 NAND strings NS that are coupled electrically to one bit line BL. In the memory block BLKi, m number of NAND strings NS may be coupled electrically to one bit line BL, m being a positive integer. According to the number of NAND strings NS which are coupled electrically to one bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are coupled electrically to one conductive material extending in the first direction, it is to be noted that the embodiment is not limited to having 3 NAND strings NS coupled electrically to one conductive material extending in the first direction. For example, n number of NAND strings NS may be coupled electrically to one conductive material extending in the first direction, n being a positive integer. According to the number of NAND strings NS which are coupled electrically to one conductive material extending in the first direction, the number of bit lines 5331 to 5333 may be controlled as well.

Figure 8:
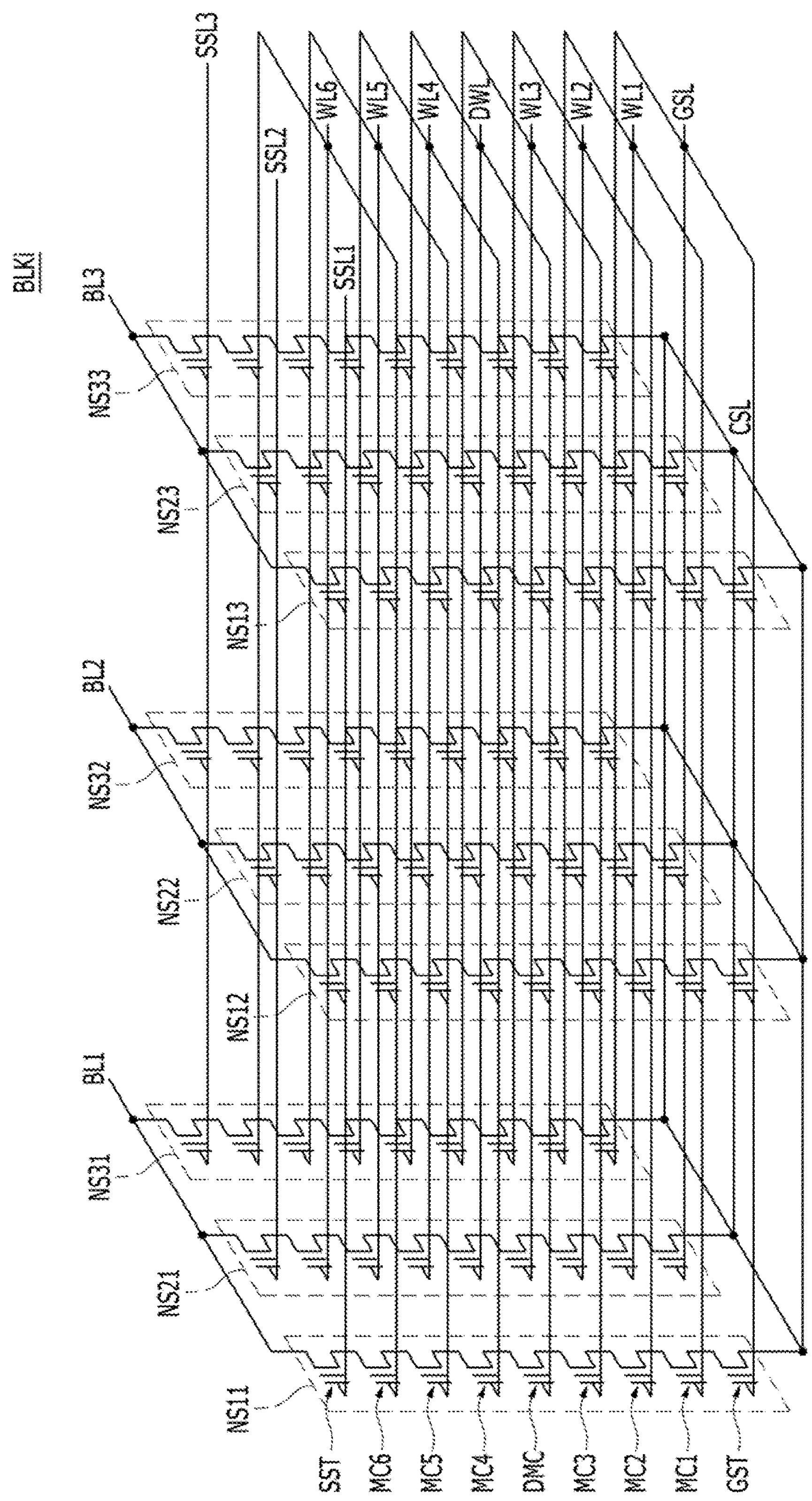

FIG. 8 is an equivalent circuit diagram illustrating the memory block BLKi having a first structure described with reference to FIGS. 5 to 7.

Referring to FIG. 8, in a block BLKi having the first structure, NAND strings NS11 to NS31 may be provided between a first bit line BL1 and a common source line CSL. The first bit line BL1 may correspond to the conductive material 5331 of FIGS. 5 and 6, extending in the third direction. NAND strings NS12 to NS32 may be provided between a second bit line BL2 and the common source line CSL. The second bit line BL2 may correspond to the conductive material 5332 of FIGS. 5 and 6, extending in the third direction. NAND strings NS13 to NS33 may be provided between a third bit line BL3 and the common source line CSL. The third bit line BL3 may correspond to the conductive material 5333 of FIGS. 5 and 6, extending in the third direction.

A source select transistor SST of each NAND string NS may be coupled electrically to a corresponding bit line BL. A ground select transistor GST of each NAND string NS may be coupled electrically to the common source line CSL. Memory cells MC may be provided between the source select transistor SST and the ground select transistor GST of each NAND string NS.

In this example, NAND strings NS may be defined by units of rows and columns and NAND strings NS which are coupled electrically to one bit line may form one column. The NAND strings NS11 to NS31 which are coupled electrically to the first bit line BL1 may correspond to a first column, the NAND strings NS12 to NS32 which are coupled electrically to the second bit line BL2 may correspond to a second column, and the NAND strings NS13 to NS33 which are coupled electrically to the third bit line BL3 may correspond to a third column. NAND strings NS which are coupled electrically to one source select line SSL may form one row. The NAND strings NS11 to NS13 which are coupled electrically to a first source select line SSL1 may form a first row, the NAND strings NS21 to NS23 which are coupled electrically to a second source select line SSL2 may form a second row, and the NAND strings NS31 to NS33 which are coupled electrically to a third source select line SSL3 may form a third row.

In each NAND string NS, a height may be defined. In each NAND string NS, the height of a memory cell MC1 adjacent to the ground select transistor GST may have a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST may be 7.

The source select transistors SST of the NAND strings NS in the same row may share the source select line SSL. The source select transistors SST of the NAND strings NS in different rows may be respectively coupled electrically to the different source select lines SSL1, SSL2 and SSL3.

The memory cells at the same height in the NAND strings NS in the same row may share a word line WL. That is, at the same height, the word lines WL coupled electrically to the memory cells MC of the NAND strings NS in different rows may be coupled electrically. Dummy memory cells DMC at the same height in the NAND strings NS of the same row may share a dummy word line DWL. Namely, at the same height or level, the dummy word lines DWL coupled electrically to the dummy memory cells DMC of the NAND strings NS in different rows may be coupled electrically.

The word lines WL or the dummy word lines DWL located at the same level or height or layer may be coupled electrically with one another at layers where the conductive materials 5211 to 5291, 5212 to 5292 and 5213 to 5293 which extend in the first direction may be provided. The conductive materials 5211 to 5291, 5212 to 5292 and 5213 to 5293 which extend in the first direction may be coupled electrically in common to upper layers through contacts. At the upper layers, the conductive materials 5211 to 5291, 5212 to 5292 and 5213 to 5293 which extend in the first direction may be coupled electrically. In other words, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be coupled electrically to the ground select line GSL.

The common source line CSL may be coupled electrically to the NAND strings NS. Over the active regions and over the substrate 5111, the first to fourth doping regions 5311 to 5314 may be coupled electrically. The first to fourth doping regions 5311 to 5314 may be coupled electrically to an upper layer through contacts and, at the upper layer, the first to fourth doping regions 5311 to 5314 may be coupled electrically.

Namely, as shown in FIG. 8, the word lines WL of the same height or level may be coupled electrically. Accordingly, when a word line WL at a specific height is selected, all NAND strings NS which are coupled electrically to the word line WL may be selected. The NAND strings NS in different rows may be coupled electrically to different source select lines SSL. Accordingly, among the NAND strings NS coupled electrically to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells MC1 to MC3 adjacent to the ground select transistor GST may be referred to as a lower memory cell group, and memory cells MC4 to MC6 adjacent to the string select transistor SST may be referred to as an upper memory cell group.

Hereinbelow, detailed descriptions will be made with reference to FIGS. 9 to 11, which show the memory device in the memory system according to an embodiment implemented with a three-dimensional (3D) nonvolatile memory device different from the first structure.

Figure 9:
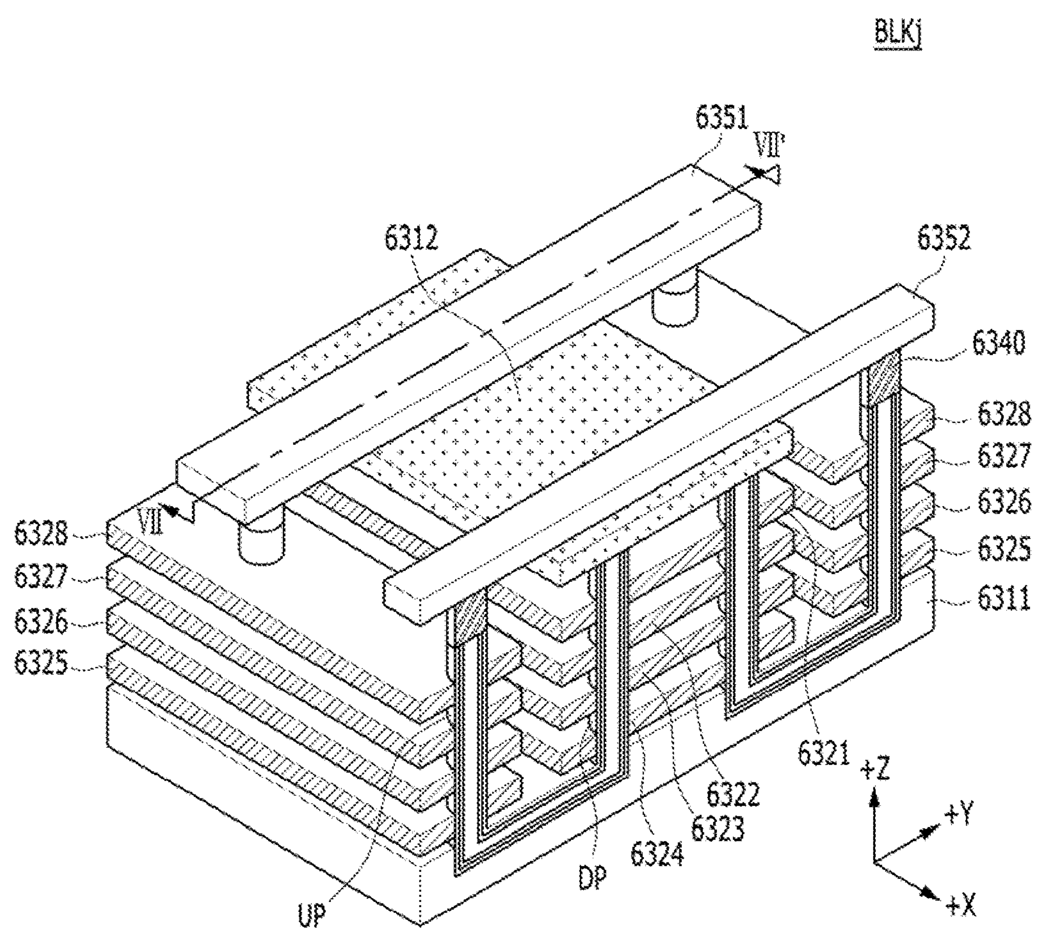

FIG. 9 is a perspective view schematically illustrating the memory device implemented with the three-dimensional (3D) nonvolatile memory device, which is different from the first structure described above with reference to FIGS. 5 to 8, and showing a memory block BLKJ of the plurality of memory blocks of FIG. 4. FIG. 10 is a cross-sectional view illustrating the memory block BLKJ taken along the line VII-VII' of FIG. 9.

Figure 10:
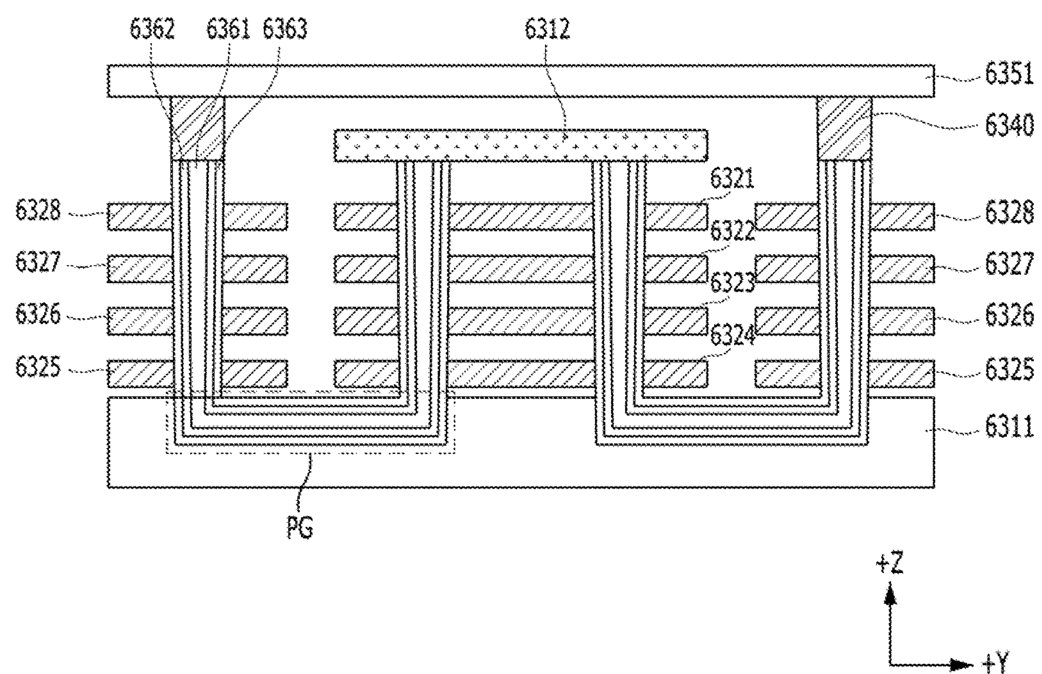

Referring to FIGS. 9 and 10, the memory block BLKJ among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well (e.g., a pocket p-well), and include an n-type well which surrounds the p-type well. While it is assumed in the embodiment for the sake of convenience that the substrate 6311 is p-type silicon, it is to be noted that the substrate 6311 is not limited to being p-type silicon.

First to fourth conductive materials 6321 to 6324 which extend in the x-axis direction and the y-axis direction are provided over the substrate 6311. The first to fourth conductive materials 6321 to 6324 may be separated by a predetermined distance in the z-axis direction.

Fifth to eighth conductive materials 6325 to 6328 which extend in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Also, a plurality of upper pillars UP which pass through the fifth to eighth conductive materials 6325 to 6328 may be provided. Each upper pillar UP extends in the z-axis direction.

Each of the lower and upper pillars DP and UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be coupled electrically through a pipe gate PG. The pipe gate PG may be disposed in the substrate 6311. For instance, the pipe gate PG may include the same material as the lower pillar DP and the upper pillar UP.

A doping material 6312 of a second type extending in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 which extend in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be coupled electrically through contact plugs. The first and second upper conductive materials 6351 and 6352 respectively serve as first and second bit lines BL1 and BL2.

The first conductive material 6321 may serve as a source select line SSL, the second conductive material 6322 may serve as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be coupled electrically through the pipe gate PG. One end of the lower string may be coupled electrically to the doping material 6312 of the second type which serves as the common source line CSL. One end of the upper string may be coupled electrically to a corresponding bit line through the drain 6340. One lower string and one upper string form one cell string which is coupled electrically between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
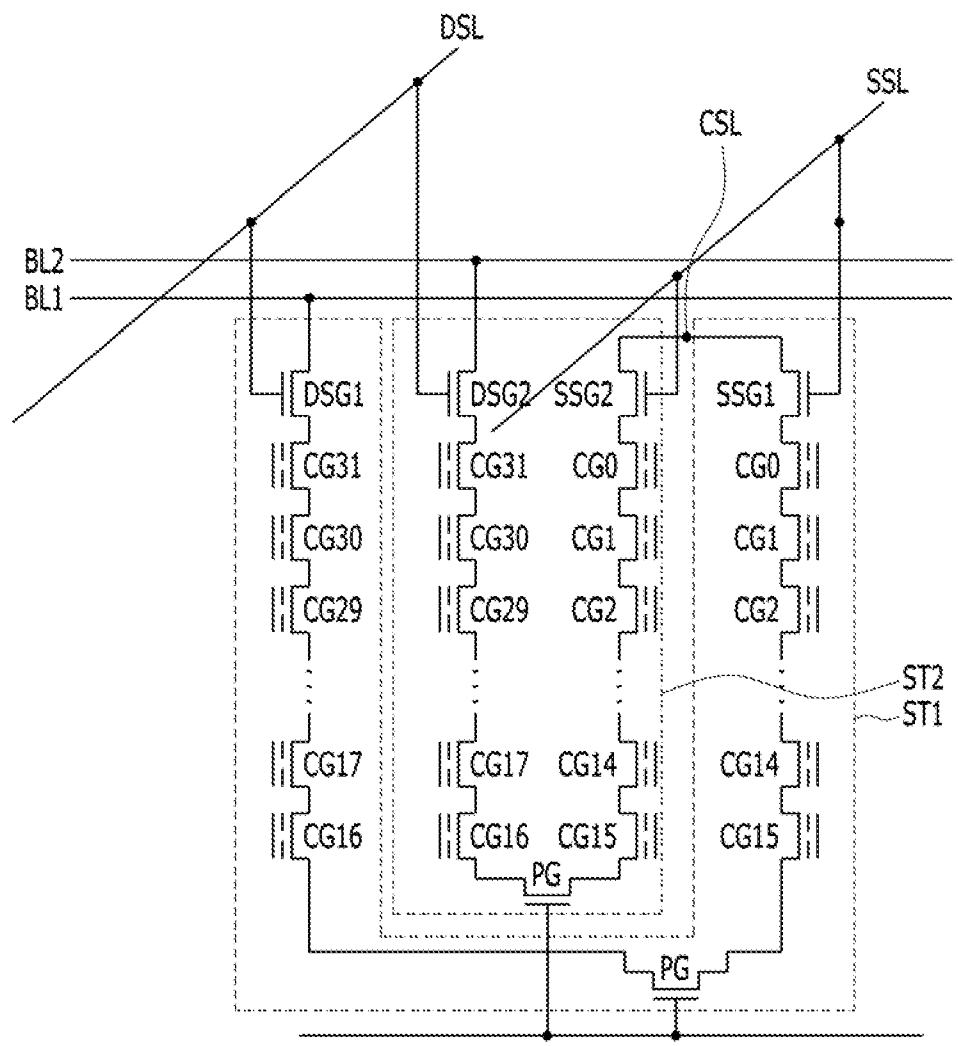

FIG. 11 is a circuit diagram illustrating the equivalent circuit of the memory block BLKj having the second structure as described above with reference to FIGS. 9 and 10. For the sake of convenience, only a first string and a second string, which form a pair in the memory block BLKj in the second structure are shown.

Referring to FIG. 11, in the memory block BLKJ having the second structure among the plurality of blocks of the memory device 150, cell strings, each of which is implemented with one upper string and one lower string coupled electrically through the pipe gate PG as described above with reference to FIGS. 9 and 10, may be provided in such a way as to define a plurality of pairs.

Namely, in the certain memory block BLKJ having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be coupled electrically to the same drain select line DSL and the same source select line SSL. The first string ST1 may be coupled electrically to a first bit line BL1, and the second string ST2 may be coupled electrically to a second bit line BL2.

While it is described in FIG. 11 that the first string ST1 and the second string ST2 are coupled electrically to the same drain select line DSL and the same source select line SSL, it may be envisaged that the first string ST1 and the second string ST2 may be coupled electrically to the same source select line SSL and the same bit line BL, the first string ST1 may be coupled electrically to a first drain select line DSL1 and the second string ST2 may be coupled electrically to a second drain select line DSL2. Further it may be envisaged that the first string ST1 and the second string ST2 may be coupled electrically to the same drain select line DSL and the same bit line BL, the first string ST1 may be coupled electrically to a first source select line SSL1 and the second string ST2 may be coupled electrically a second source select line SSL2.

Hereinafter, referring to FIGS. 12 to 18, a memory system and an operating method thereof will be explained in more detail.

Figure 12:
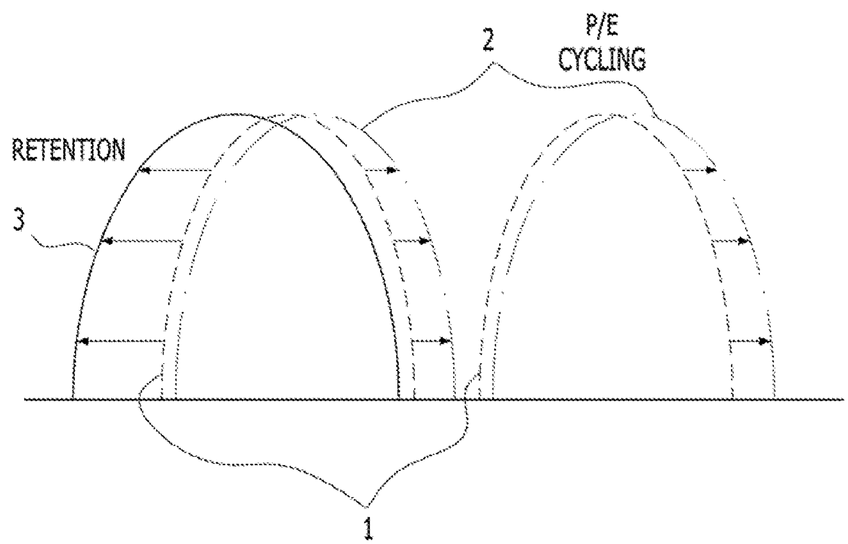
FIG. 12 is a diagram illustrating changes in threshold voltage distributions of memory cells.

FIG. 12 is a diagram illustrating changes in threshold voltage distributions of memory cells.

Referring to FIG. 12, initial distributions 1 of the memory cells may be changed in the right direction according to an increase in the count of performing program/erase operations (P/E cycling), as shown by reference numeral 2.

The initial distributions 1 of the memory cells may be changed in the left direction because of retention characteristics relating to data preservation, as shown by reference numeral 3. For example, based on deteriorating retention characteristics of the memory cells, threshold voltages of the memory cells may be lowered, i.e., the threshold voltage distribution may shift to the left, due to an increasing leakage of electrons stored in a floating gate (or a charge storage layer) over time.

The threshold voltage distribution of the memory cells may be changed by various reasons, for example, an operation temperature or a read count, as well as a phenomenon discussed above in reference to FIG. 12. As a result of a substantially changed threshold voltage distribution, a read operation of some of the memory cells may fall depending upon the value of a read voltage employed in a read operation. In more detail, in the case where an arbitrary read voltage is applied, a cell having a threshold voltage positioned at the left of the read voltage may be read as '0', whereas a cell having a threshold voltage at the right of the read voltage may be read as '1'. However, when two adjacent threshold voltage distributions overlap due to a change of a threshold voltage distribution, a read operation may fail (hereinafter, this will be referred to as a read fail).

In the case where a read fall occurs, a read voltage level may be changed with reference to a read retry table (RRT), and a read operation is re-performed. This is referred to as a read retry operation. The RRT may include a plurality of preset read voltages. When a read retry operation is performed, a read voltage with which a subsequent read retry operation is performed may be determined according to a read voltage sequence of the RRT. If the number of error bits generated by performing a read operation with a changed read voltage is equal to or less than the number of correctable error bits, the read operation is passed. When error correction is difficult after a read operation, an additional read retry operation is performed, whereby a fall occurrence rate of the read operation may be reduced, and the reliability may be enhanced.

A program operation of the memory device may be performed in a sequence from memory cells MC0 adjacent to a source select transistor SST to memory cells MCn−1 adjacent to a drain select transistor DST as shown in FIG. 3. In general, a program operation of a selected memory block is performed until program operations of all pages of the selected memory block are completed. However, because of a user design or due to a particular external factor, program operations of only some pages of a memory block may be completed, whereas program operations of the other remaining pages are not performed. A memory block in which program operations for all pages are completed is called a closed block, while a memory block in which program operations for only some pages are completed is called an open block.

Figure 13:
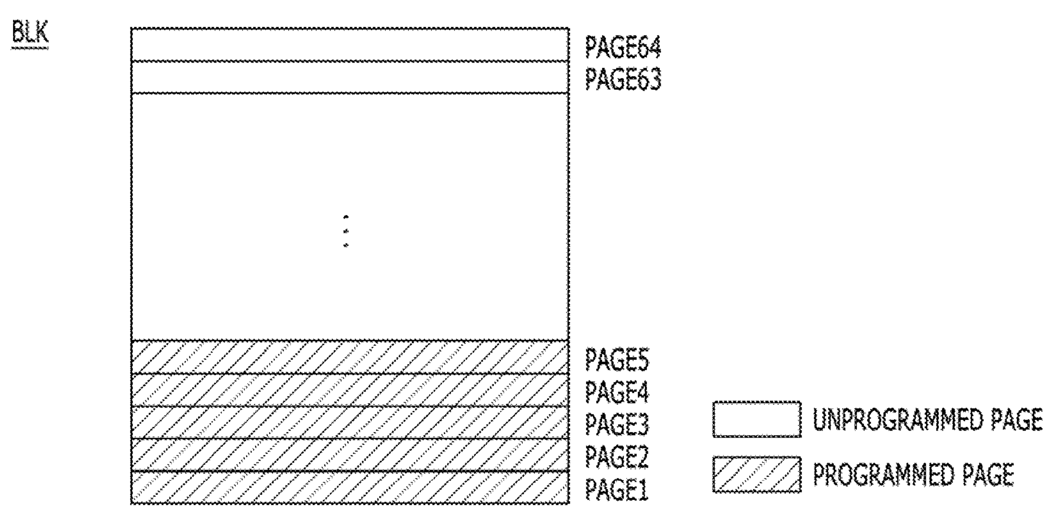
FIG. 13 is a diagram illustrating an open block among the memory blocks shown in FIG. 2.

FIG. 13 is a simplified diagram illustrating an open block among the memory blocks shown in FIG. 2.

Referring to FIG. 13, there is illustrated the case where a memory block BLK is configured by sixty-four pages. First to fifth pages PAGE1 to PAGE5 are programmed pages, and sixth to sixty-fourth pages PAGE6 to PAGE64 are unprogrammed pages. For reference, whether all pages of the memory block BLK have been programmed may be determined by checking whether an address of a stored lastly-programmed-page (that is, the fifth page PAGE5) is identical to an address of the last page (that is, the sixty-fourth page PAGE64) of the corresponding block. As such, the open block includes both the programmed pages PAGE1 to PAGE5 and the unprogrammed pages PAGE6 to PAGE64. Therefore, during a read operation which is performed after the program operation, when an identical pass voltage is applied to the unselected word lines, read disturb may increase due to a threshold voltage difference of memory cells. Furthermore, there may be a difference in degree of interference depending on a state of a block, that is, whether the block is a closed block or an open block.

The plurality of read voltages preset in the RRT are optimized for closed blocks. Therefore, in the case where a read retry operation for an open block is performed using a read voltage level in the same manner as that of the closed blocks, the read operation may eventually fall because the open block is not restored.

Hereinafter, according to an embodiment of the present invention, when a read fall occurs, a read retry method is provided which includes separating an open block and a closed block, and performing a retry operation.

Figure 14:
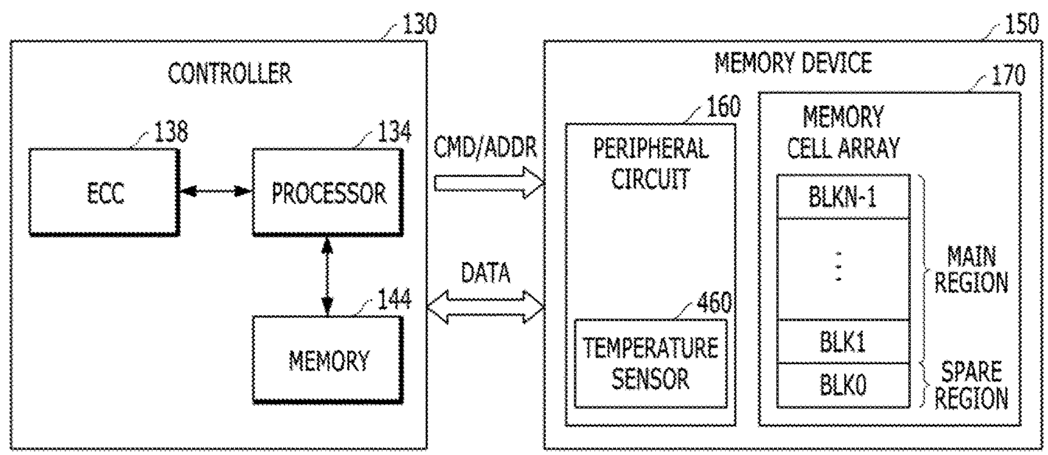
FIG. 14 is a block diagram illustrating a memory system including a memory device coupled to a controller, in accordance with an embodiment of the present invention.

FIG. 14 is a simplified block diagram illustrating a memory system 110, in accordance with an embodiment of the present invention. The memory system 110 shown in FIG. 14 may correspond to the memory system 110 of the data processing system 100 of FIG. 1, and is illustrated as including the configurations required for describing the gist of the embodiment, that is, a controller 130 including a processor 134, an ECC unit 138, and a memory 144 and a memory device 150 coupled to the controller 130 the memory device including a peripheral circuit 160 and a memory array 170

The memory device 150 may include a plurality of blocks BLK0 to BLKN−1 each of which includes a plurality of pages (not shown), and may perform a read operation in response to a command CMD and an address ADDR received from the controller. The controller 130 may generate a command CMD and an address ADDR for controlling a read operation of the memory device 150. When a read fail occurs, the controller 130 determines whether the block in which the read fall has occurred is an open block, i.e., whether the block in which the read fail has occurred includes at least one unprogrammed page. If the block in which the read fail has occurred is an open block, the controller 130 may then apply a restoration algorithm to the at least one unprogrammed page, based on operational temperature information and/or a read count, and then generate a command CMD for performing a read retry operation.

The detailed configuration of the controller 130 has been already described with reference to FIG. 1. Repeating such description would be redundant and is therefore omitted.

The memory cell array 170 of the memory device 150 may include a plurality of blocks BLK0 to BLKN−1 each of which includes a plurality of pages (not shown). The plurality of blocks BLK0 to BLKN−1 are divided into closed blocks, i.e., memory blocks in which program operations for all pages have been completed, and open blocks in each of which program operations for only some pages have been completed. The peripheral circuit 160 may control the operation of the memory cell array 170, in response to a command CMD and an address ADDR which are received from the controller 130. For example, the peripheral circuit 160 may output, in response to a read command CMD during a read operation, page data DATA of a block corresponding to an address ADDR to the controller 130. Also, the peripheral circuit 160 may program, in response to a write command CMD during a program operation, received page data DATA on a page of a block corresponding to an address ADDR.

The peripheral circuit 160 may include a temperature sensor 460. The temperature sensor 460 may measure a first temperature at a time when page data DATA is programmed during a program operation, and a second temperature at a time at which page data DATA is outputted during a read operation. The temperature sensor 460 may provide operation temperature information based on the measured first and/or second temperatures.

In the case where the memory device 150 is a nonvolatile memory device, such as, for example, a flash memory, the memory cell array 170 may include a main region and a spare region. For example, as shown in FIG. 14, blocks BLK1 to BLKN−1 may be allocated to the main region, and a block BLK0 may be allocated to the spare region, among the plurality of blocks BLK0 to BLKN−1. The main region is a region in which user data capable of being accessed by a user is stored. The spare region is a region in which system data is stored. The system data may include data for assisting user data, for example, error correction information, or data required for managing the memory device 150, for example, state information or fault information. In an embodiment, the system data stored in the spare region of the memory cell array 170 may include at least one information selected form the group including operation temperature information provided from the temperature sensor 460, open/closed block information about whether a corresponding block is a closed block or an open block, and respective read counts of the blocks. As described above, a closed block represents a block in which program operations for all pages of the block have been completed. An open block represents a block in which program operations for only some of its pages have been completed. When the system is powered on, system data stored in the spare region of the memory cell array 170 may be transmitted to and stored in the memory 144 of the controller 130.

The controller 130 may generate a command CMD for performing a restoration algorithm for an unprogrammed page of an open block using the open/closed block information, the operation temperature information and the read count that are stored in the memory 144. That is, the controller 130 may generate a command CMD for performing a restoration algorithm for an unprogrammed page when a difference in temperature is greater than or equal to a reference value A. The difference in temperature represents a difference between a temperature at a time at which data of a programmed page of an open block is written and a temperature at a time at which the data is read. The controller 130 may generate a command CMD for performing a restoration algorithm for an unprogrammed page when the read count of the open block is greater than or equal to a certain reference value B.

In the case where a read operation for an open block is performed, there are a first condition, a second condition and a third condition. The first condition represents a condition in which, while program operations are performed in response to write commands which are successively inputted, a read command for lately programmed page data is inputted. The second condition represents a condition in which a read command is inputted after the program operations have been completed. The third condition represents a condition in which, after power-on, a read command for a block on which the last program operation has been performed is inputted.

In the embodiment, when a difference between a temperature at a time at which data of the programmed page of the open block is written and a temperature at a time at which the data is read is greater than or equal to the reference value A, and/or when the read count of the open block is greater than or equal to the certain reference value B, the restoration algorithm for the unprogrammed page of the open block may be performed as follows under the first to third conditions.

In the case where a read fall occurs under the first condition, the controller 130 may control the memory device 150 to program, in response to a write command, page data DATA which is continuously inputted, on unprogrammed pages of the open block. In the case where a read fail occurs under the second condition, the controller 130 may control the memory device 150 to program, after the program operations, data stored in a page buffer and system data, on unprogrammed pages of the open block. In the case where a read fail occurs under the third condition, the controller 130 may control the memory device 150 to perform a dummy data program for unprogrammed pages of the open block. For this, the controller 130 may include a storage unit which stores dummy data for the dummy data program. The memory 144 provided in the controller 130 may be used as the storage unit. The dummy data may be arbitrary data which is randomly generated.

As described above, in accordance with an embodiment of the present invention, the controller 130 may perform a restoration algorithm of performing an additional program operation for an unprogrammed page of an open block in which a read fall has occurred. The restoration algorithm may be repeated until the open block in which the read fall has occurred is converted into a closed block.

Figure 15:
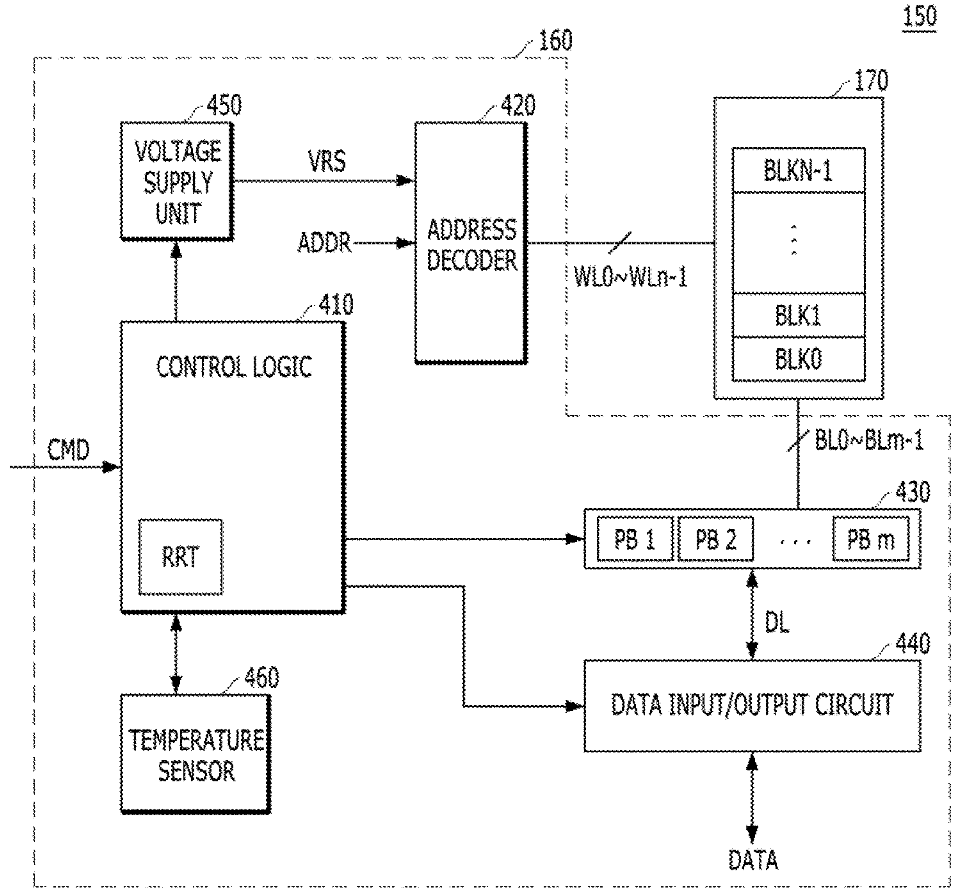
FIG. 15 is a block diagram illustrating an exemplary configuration of the memory device of FIG. 14.

FIG. 15 provides a more detailed configuration for the memory device 150 of FIG. 14.

Referring to FIG. 15, the peripheral circuit 160 of the memory device 150 may include a control logic 410, an address decoder 420, a read/write circuit 430, a data input/output circuit 440, a voltage supply unit 450 and the temperature sensor 460.

The address decoder 420 is coupled to the memory cell array 170 through word lines WL1 to WLn−1. The address decoder 420 is configured to operate in response to control of the control logic 410. The address decoder 420 decodes an address ADDR inputted from the outside (e.g., the controller 130 in FIG. 14), generates a block address, and selects, according to the generated block address, one memory block among the plurality of memory blocks BLK0 to BLKN−1 of the memory cell array 170. The address decoder 420 decodes the address ADDR, generates a row address, and selects one of the word lines WL1 to WLn−1 that is coupled to a memory block selected according to the generated row address. The address decoder 420 is configured to receive operating voltages VRS provided from the voltage supply unit 450 and provide the operating voltages VRS to the selected word line and unselected word lines. For instance, during a read operation, the address decoder 420 may provide a read voltage VREAD to a selected word line and provide a pass voltage VPASS to unselected word lines. The address decoder 420 may include a block decoder, a row decoder, an address buffer, etc.

The read/write circuit 430 is coupled to the memory cell array 170 through the bit lines BL0 to BLm−1 and coupled to the data input/output circuit 440 through data lines DL. The read/write circuit 430 is configured to operate in response to control of the control logic 410. During a program operation, the read/write circuit 430 receives page data DATA from the data input/output circuit 440 and transmits it to the bit lines BL0 to BLm−1. The transmitted page data DATA is programmed on memory cells coupled to a selected word line. During a read operation or read retry operation, the read/write circuit 430 reads, through the bit lines BL0 to BLm−1, page data of the memory cells coupled to the selected word line, and outputs the read data DATA to the data input/output circuit 440 through the data lines DL. During an erase operation, the read/write circuit 430 may float the bit lines BL0 to BLm−1. In an embodiment, the read/write circuit 430 may include a plurality of page buffers PB1 to PBm which respectively correspond to the bit lines BL0 to BLm−1 and are coupled to the memory cell array 170 through the corresponding bit lines BL0 to BLm−1. Each of the plurality of page buffers PB1 to PBm may include a plurality of latches.

The data input/output circuit 440 is coupled to the read/write circuit 430 through the data lines DL. The data input/output circuit 440 operates in response to control of the control logic 410. The data input/output circuit 440 communicates data DATA with the outside. During to a program operation, the data input/output circuit 440 transmits page data DATA inputted from the outside, to the read/write circuit 430. During a read operation, the data input/output circuit 440 receives page data DATA read from the read/write circuit 430, and outputs the read page data DATA to the outside.

The voltage supply unit 450 generates and supplies operating voltages VRS for read, program (or write) and erase operations in response to control of the control logic 410. The operating voltages VRS may include, according to operation modes, voltages (for example, select read voltages and unselect read voltages) needed for a read operation, voltages (for example, program voltages) needed for a program operation, and voltages (for example, voltages to be applied to a bulk region in which memory cells are formed) needed for an erase operation.

The temperature sensor 460 may measure a temperature at a time at which page data DATA is programmed during a program operation, and a temperature at a time at which page data DATA is outputted during a read operation, and provide the measured temperatures to the control logic 410 as operation temperature information.

The control logic 410 is coupled to the address decoder 420, the read/write circuit 430, the data input/output circuit 440, the voltage supply unit 450 and the temperature sensor 460. The control logic 410 may be configured to receive a command CMD through an input/output buffer (not shown) of the memory device 150 and control the overall operations including a read, program (or write) and erase operations of the memory device 150 in response to the command CMD.

According to an embodiment of the present invention, the control logic 410 may control, when power-on, the address decoder 420, the read/write circuit 430, the data input/output circuit 440 and the voltage supply unit 450, read out system data from the spare region of the memory cell array 170, and transmit the system data to the memory 144 of the controller (130 of FIG. 14). In this regard, the system data may include operation temperature information provided from the temperature sensor 460, open/closed block information about whether a corresponding block is a closed block in which program operations for all pages have been completed or an open block in which program operations for only some pages have been completed, and respective read counts of the blocks.

Furthermore, the control logic 410 may control the address decoder 420, the read/write circuit 430, the data input/output circuit 440 and the voltage supply unit 450 so that, during a read operation, a read retry operation for a block in which read fail has occurred is performed. The control logic 410 may include a read retry table RRT including a plurality of preset read voltages. That is, when a command CMD for performing a read retry operation is received from the controller 130, the control logic 410 may control the address decoder 420, the read/write circuit 430, the data input/output circuit 440 and the voltage supply unit 450 so as to change a read voltage level according to a read voltage sequence of the read retry table RRT and perform a read retry operation which is an operation of performing at least one read operation.

The control logic 410 may control, when a command CMD for performing a restoration algorithm is received from the controller 130, the address decoder 420, the read/write circuit 430, the data input/output circuit 440 and the voltage supply unit 450 so as to perform an additional program operation for an unprogrammed page of an open block under a corresponding condition among the above-described first to third conditions. That is, the control logic 410 may control the elements so that, after the restoration algorithm has been performed, the open block is converted into a closed block.

Although, in the embodiment, there has been illustrated the case where the read retry table RRT is provided in the control logic 410 of the memory device 150, the embodiment is not limited to this. In another embodiment, the read retry table RRT may be provided in the controller 130.

Figure 16:
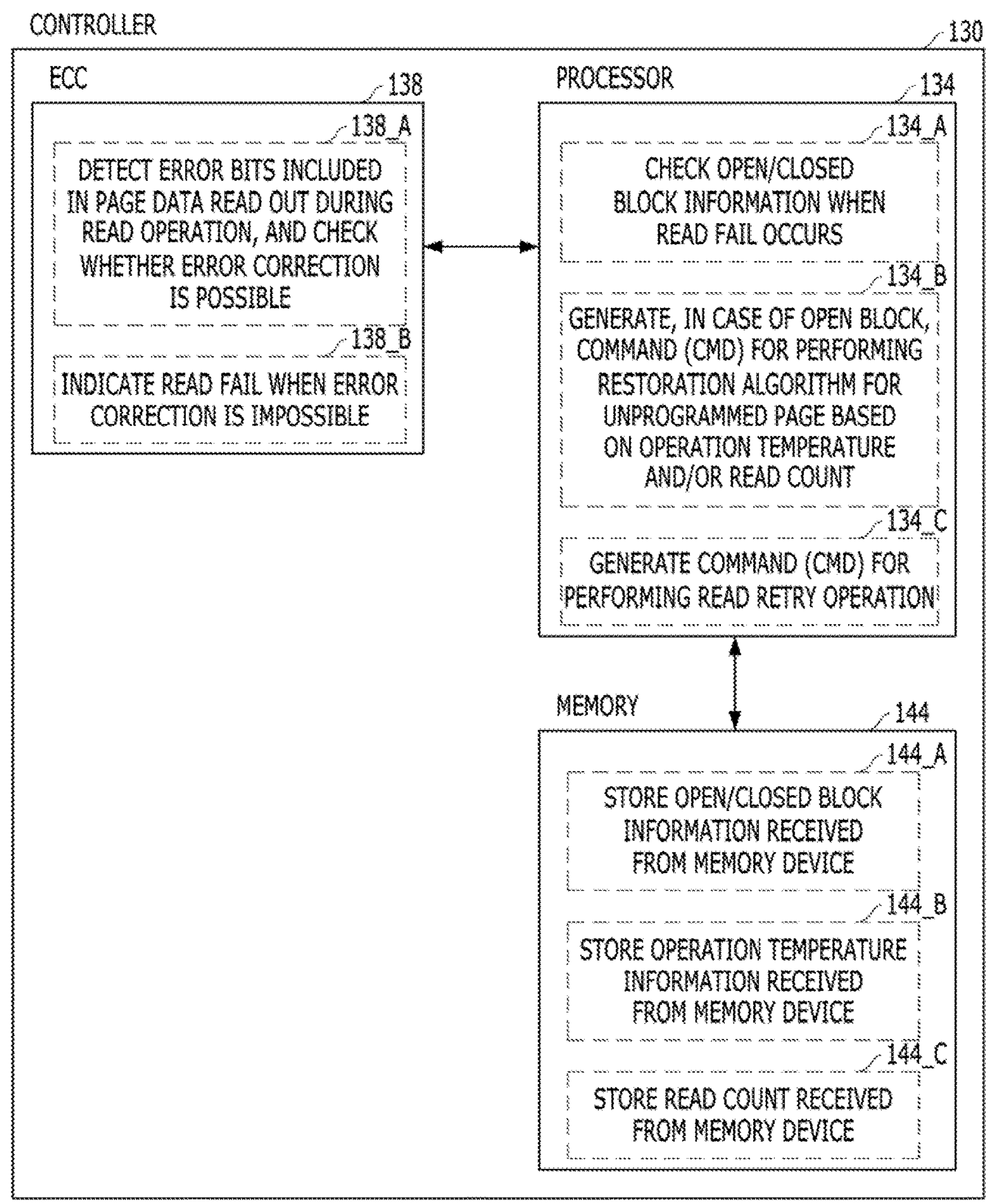
FIG. 16 is a block diagram illustrating an exemplary configuration of the controller of FIG. 14.

FIG. 16 is a block diagram illustrating the controller 130 of FIG. 14.

Referring to FIG. 16, the controller 130 may include the processor 134, the ECC unit 138 and the memory 144.

The ECC unit 138 may detect, when reading data stored in the memory device 150 during a read operation, an error bit included in page data DATA read out from the memory device 150, and determine whether error correction is possible (138_A). The ECC unit 138 may output, when the number of occurred error bits is greater than or equal to a correctable error bit threshold value, an error correction fail signal indicating a read fail (138_B).

The memory 144 may be an operating memory for the memory system 110 and the controller 130 and store data needed for performing read, program (or write) and erase operations between the memory device 150 and the controller 130. In particular, the memory 144 may include a first region 144_A for storing open/closed block information received from the memory device 150 when power-on, a second region 144_B for storing operation temperature information received from the memory device 150, and a third region 144_C for storing respective read counts of the blocks received from the memory device 150.

The processor 134 may control the general operations of the memory system 110, and control, in response to a write request or read request from a host 102, a program operation or read operation for the memory device 150.

Operation of the processor 134 in accordance with an embodiment of the invention includes the following.

First, the processor 134 may check, when an error correction fall signal indicating a read fall is received from the ECC unit 138, whether a block in which the read fail has occurred is an open block or closed block based on open/closed block information stored in the first region 144_A of the memory 144 (134_A). In the case where the corresponding block is an open block, the processor 134 may generate a command CMD for performing a restoration algorithm for an unprogrammed page of the open block, based on operation temperature information stored in the second region 144_B and/or a read count stored in the third region 144_C, and transmit the command CMD to the memory device 150 (134_B). Furthermore, the processor 134 may generate a command CMD for performing a read retry operation, when an error correction fail signal indicating a read fall is received from the ECC unit 138 (134_C). In the case where the block in which the read fall has occurred is an open block, a command CMD for performing a restoration algorithm based on the operation temperature information and/or the read count may be generated (134_B), before a command CMD for performing a read retry operation is generated (134_C). The processor 134 may control the count of read retry operations performed in the open block so that it is equal to or greater than the count of read retry operations performed in the closed block.

In some embodiments, an operating method of the memory system may be a method in which, on a read fail, when a block in which the read fail has occurred is an open block, a read retry operation is performed after a restoration algorithm for an unprogrammed page of the open block has been performed based on the operation temperature information and/or the read count. Alternatively, an operating method of the memory system may be a method in which, on a read fail, a read retry operation is first performed, and if a read fail occurs as a result of performing the read retry operation, only when the block in which the read fail has occurred is an open block, a restoration algorithm is performed based on the operation temperature information and/or the read count, and then a read retry operation is performed again.

Hereinafter, operating methods of memory systems, in accordance with two embodiments of the present invention, will be described with reference to FIGS. 17 and 18.

Figure 17:
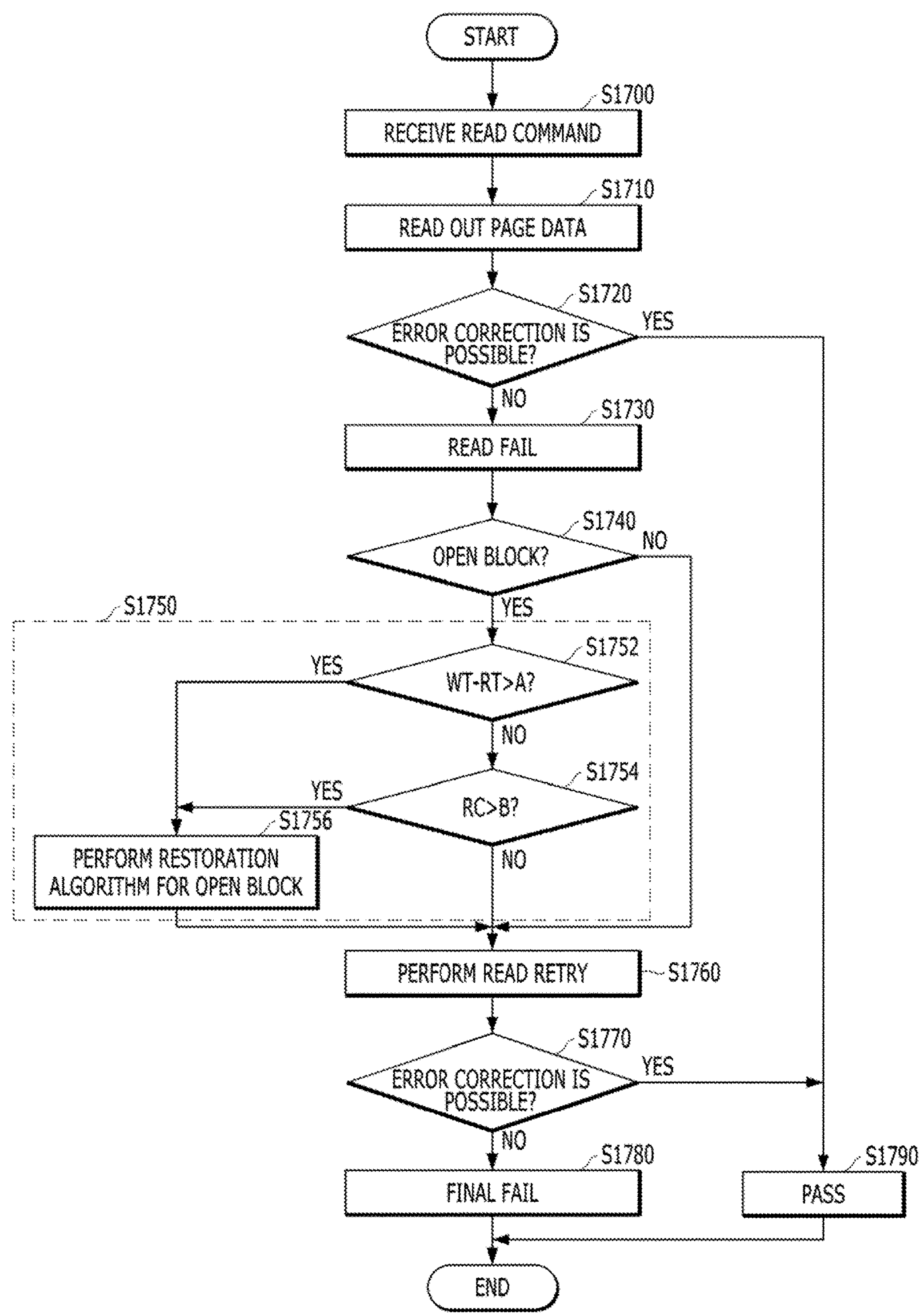
FIG. 17 is a flowchart illustrating an operating method of a memory system, in accordance with an embodiment of the present invention.

FIG. 17 is a flowchart showing an operating method of a memory system, in accordance with an embodiment of the present invention.

Referring to FIG. 17, the processor 134 of the controller 130 receives a read command from the host 102 and performs a read operation corresponding to the read command (at S1700). The ECC unit 138 of the controller 130 receives, during the read operation corresponding to the read command, page data DATA read out from the memory device 150 (at S1710). The ECC unit 138 may detect error bits included in the read-out page data DATA and check whether error correction is possible (at S1720). The ECC unit 138 may output, when the number of occurred error bits is greater than or equal to a correctable error bit threshold value (NO at S1720), an error correction fail signal for indicating a read fail may be outputted (at S1730). When it is determined that the number of occurred error bits is less than the correctable error bit threshold value (YES at S1720), the process proceeds to a step S1790.

When a read fall occurs, the processor 134 of the controller 130 determines whether a block in which the read fail has occurred is an open block including an unprogrammed page (at S1740). In this regard, the processor 134 may determine whether the block in which the read fail has occurred is an open block or a closed block, based on open/closed block information stored in the first region 144_A of the memory 144.

When it is determined that the corresponding block is an open block (YES at S1740), the processor 134 generates a command CMD for performing a restoration algorithm for the unprogrammed page of the open block, based on the operation temperature information stored in the second region 144_B of the memory 144 and/or the read count stored in the third region 144_C of the memory 144, and the memory device 150 performs a restoration algorithm for the unprogrammed page of the open block in response to the command CMD (at S1750). When it is determined that the corresponding block is not an open block (NO at S1740), the process proceeds to a step S1760.

In more detail, the processor 134 checks whether a difference between a temperature WT at a time at which data of the programmed page of the open block is written and a temperature RT at a time at which the data is read is greater than or equal to a reference value A (at S1752). When the temperature difference (WT-RT) is greater than or equal to the reference value A (YES at S1752), the memory system 110 may perform the restoration algorithm for the unprogrammed page (at S1756). When it is determined that the temperature difference (WT-RT) is less than the reference value A (NO at S1752), the process proceeds to a step S1754. The processor 134 checks whether the read count RC of the open block is greater than or equal to a certain reference value B (at S1754). When the read count RC of the open block is greater than or equal to the certain reference value B (YES at S1754), the processor 134 may perform the restoration algorithm for the unprogrammed page (at S1756) and proceed to a step S1760. When it is determined that the read count RC of the open block is less than the certain reference value B (NO at S1754), the process proceeds to the step S1760.

After the restoration algorithm has been performed, as described above, the open block in which the read fail has occurred may be converted into a closed block. For reference, in the case where the difference between the temperature WT at a time at which the data is written and the temperature RT at a time at which the data is read is greater than or equal to the reference value A, or in the case where the read count RC of the block is greater than or equal to the certain reference level B, this means that the possibility of deterioration of the corresponding block is high. Therefore, in accordance with the embodiment, the operating speed and the reliability of the memory system may be traded off by performing, among open blocks in which read fails have occurred, a restoration algorithm for an open block having higher possibility of deterioration.

If a block in which a read fail has occurred is not an open block (NO at S1740) or the temperature difference (WT-RT) is less than the reference value A and the read count RC of the open block is less than the certain reference value B (NO at S1752 and NO at S1754), a restoration algorithm for the corresponding block is not performed.

Thereafter, the processor 134 generates a command CMD for performing a read retry operation, and the memory device 150 performs the read retry operation in response to the command CMD (at S1760).

After the read retry operation has been performed, the ECC unit 138 of the controller 130 may detect again error bits included in the page data DATA read out from the memory device 150 and check whether error correction is possible (at S1770). If the number of occurred error bits is greater than or equal to the correctable error bit threshold value (NO at S1770), the ECC unit 138 may finally output an error correction fail signal for indicating a read fail (at S1780). In the case where the number of error bits is less than the correctable error bit threshold value (YES at S1770), errors may be corrected and a pass signal may be finally outputted (at S1790).

Figure 18:
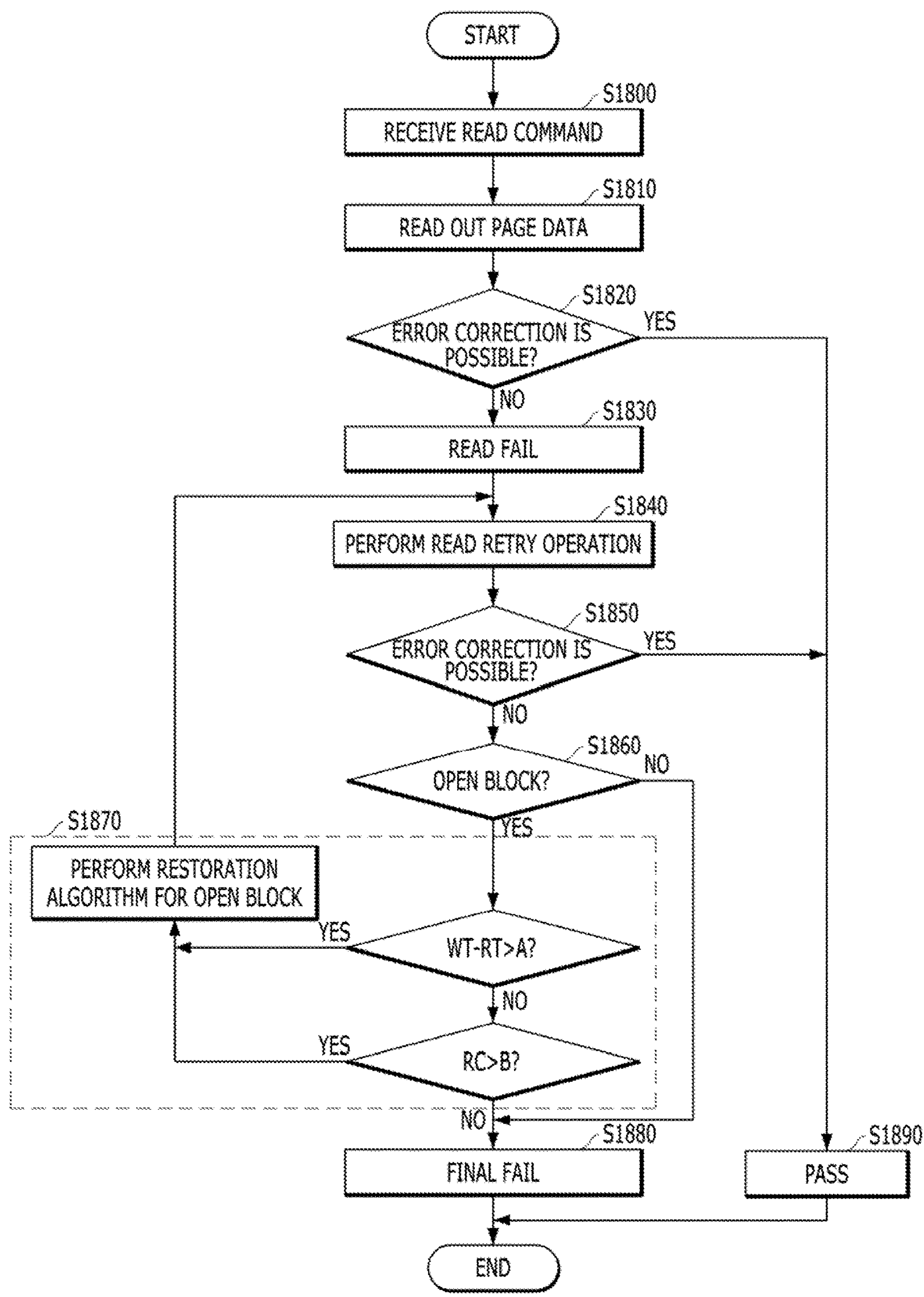
FIG. 18 is a flowchart illustrating an operating method of a memory system, in accordance with another embodiment of the present invention.

FIG. 18 is a flowchart showing an operating method of a memory system, in accordance with another embodiment of the present invention. Hereinafter, contents overlapped with the description of FIG. 17 will be described in brief or the description thereof will be omitted.

Referring to FIG. 18, the processor 134 of the controller 130 receives a read command from the host 102 and performs a read operation corresponding to the read command (at S1800). The ECC unit 138 of the controller 130 receives, during the read operation corresponding to the read command, page data DATA read out from the memory device 150 (at S1810). The ECC unit 138 may output, when the number of error bits included in the read-out page data DATA is greater than or equal to a correctable error bit threshold value (NO at S1820), an error correction fail signal for indicating a read fall may be outputted (at S1830). When it is determined that the number of error bits is less than the correctable error bit threshold value (YES at S1820), the process proceeds to a step S1890.

In the case where a read fail occurs, the processor 134 of the controller 130 generates a command CMD for performing a read retry operation, and the memory device 150 performs the read retry operation in response to the command CMD (at S1840).

After the read retry operation has been performed, the ECC unit 138 of the controller 130 may detect error bits included in the page data DATA read out from the memory device 150 and check whether error correction is possible (at S1850). If the number of occurred error bits is greater than or equal to the correctable error bit threshold value (NO at S1850), the ECC unit 138 resends an error correction fail signal indicating a read fail, and the processor 134 determines whether a block in which the read fail has occurred is an open block including an unprogrammed page, based on open/closed block information (at S1860). If it is determined that the number of occurred error bits is less than the correctable error bit threshold value (YES at S1850), the process proceeds to a step S1890.

If it is determined that the corresponding block is an open block (YES at S1860), the processor 134 generates a command CMD for performing a restoration algorithm for the unprogrammed page of the open block, based on operation temperature information and/or a read count, and the memory device 150 performs the restoration algorithm for the unprogrammed page of the open block in response to the command CMD (at S1870). After the restoration algorithm has been performed, the open block in which the read fail has occurred may be converted into a closed block.

Thereafter, the processor 134 generates a command CMD for performing a read retry operation for the open block that has been converted into a closed block, and the memory device 150 performs the read retry operation again, in response to the command CMD (at S1840).

After the read retry operation has been performed, the ECC unit 138 of the controller 130 detects again error bits included in page data DATA read out from the memory device 150 and checks whether error correction is possible (at S1850). If the number of error bits is less than the correctable error bit threshold value (YES at S1850), errors are corrected, and a pass signal may be finally outputted (at S1890).

In the case where the block in which the read fall has occurred is a closed block (NO at S1860), or in the case where, although the block in which the read fail has occurred is an open block, a temperature difference (WT-RT) is less than the reference value A and a read count RC of the open block is less than the certain reference value B, the ECC unit 138 may finally output an error correction fall signal indicating a read fail (at S1880).

The operating method of the memory system described with reference to FIG. 18 may control the count of read retry operations performed in the open block so that it is equal to or greater than the count of read retry operations performed in the closed block. Therefore, there are effects that a read fail of the open block may be prevented, and the reliability of a product may be enhanced.

As described above, a memory system and an operating method thereof are provided, wherein when a block in which a read fail has occurred is an open block, a read retry operation is performed after the block in which the read fail has occurred is converted into a closed block by performing a restoration algorithm for an unprogrammed page of the open block based on operating temperature information and/or a read count. Therefore, during a read retry operation, even when an identical read voltage level is applied regardless of whether the corresponding block is a closed block or an open block, a read fail is prevented, and the reliability of a product is enhanced.

Although various embodiments have been described for illustrative purposes, it will be apparent to those skilled in the art that various changes and modifications may be made without departing from the spirit and scope of the invention as defined in the following claims.

What is claimed is:

1. A memory system comprising:

a memory device including a plurality of blocks each block including a plurality of pages, suitable for performing an operation in response to a command and an address; and a controller suitable for determining whether a block in which a read fail has occurred is an open block including an unprogrammed page, performing a restoration operation for the unprogrammed page of the open block based on at least one of operation temperature information and a read count, when it is determined that the block in which the read fail has occurred is the open block, and generating the command for performing a read retry operation, wherein the controller generates the command for performing the restoration operation for the unprogrammed page when the read count of the open block is greater than or equal to a certain reference value.

2. The memory system according to claim 1, wherein the controller generates the command for performing the restoration operation for the unprogrammed page when a difference between a temperature at a time at which data of a programmed page of the open block is written and a temperature at a time at which the data is read is greater than or equal to a given level.

3. The memory system according to claim 1, wherein, in the case where, while program operations are performed in response successively inputted write commands, the read fail occurs when the read operation is performed in response to a read command for lately programmed page data, the restoration operation is performed by programming data that is continuously inputted in response to the write commands, on the unprogrammed page of the open block.

4. The memory system according to claim 1, wherein, in the case where, after program operations are completed, the read fail occurs while the read operation is performed in response to a read command, the restoration operation is performed by programming system data and data stored in a page buffer after the program operations, on the unprogrammed page of the open block.

5. The memory system according to claim 1, wherein, in the case where, after power-on, the read fail occurs while the read operation is performed in response to a read command for a block in which a last program operation has been performed, the restoration operation is performed by programming dummy data on the unprogrammed page of the open block.

6. The memory system according to claim 1, wherein the memory device comprises:

a memory cell array including a plurality of blocks; and a peripheral circuit suitable for controlling operation of the memory cell array in response to the command and the address, wherein the peripheral circuit comprises:

a temperature sensor suitable for measuring a temperature at a time at which data is programmed during a program operation and a temperature at a time at which the data is outputted during a read operation, and providing the operation temperature information.

7. The memory system according to claim 6, wherein the peripheral circuit comprises:

an address decoder coupled to the memory cell array through word lines and suitable for decoding the address and selecting one of the word lines;

a read/write circuit coupled to the memory cell array through bit lines and suitable for reading data from the memory cell array by driving the bit lines or drive the bit lines according to data to be stored in the memory cell array;

a voltage supply unit suitable for supplying voltages required for operation of the memory device; and a control logic suitable for controlling the address decoder, the read/write circuit and the voltage supply unit, in response to the command.

8. The memory system according to claim 7, wherein, when the command for the restoration operation is inputted, the control logic performs an additional program operation for the unprogrammed page of the open block and controls the open block so that the open block is converted into a closed block, and wherein, when the command for performing the read retry operation is inputted, the control logic performs the read retry operation by changing a read voltage level applied to the memory cell array, based on a read retry table, and performing at least one read operation.

9. The memory system according to claim 6, wherein the memory cell array comprises:

a main region configured to store user data capable of being accessed by a user; and a spare region configured to store the operation temperature information provided from the temperature sensor, open/closed block information about whether the corresponding block is a closed block in which program operations for all pages have been completed or an open block in which program operations for only some pages have been completed, and system data including the read count, wherein, when power-on, the system data stored in the spare region is transmitted to the controller.

10. The memory system of claim 9, wherein the controller comprises:

an error correction unit suitable for detecting error bits included in data read out during the read operation, and indicating the read fail when the number of detected error bits is greater than or equal to a correctable error bit threshold value;

a memory suitable for storing, when power-on, the operation temperature information, the open/closed block information and the read count that are transmitted from the spare region; and a processor suitable for checking, when the read fail occurs, whether a block in which the read fail has occurred is an open block, based on the open/closed block information, and performing, when the corresponding block is an open block, the restoration operation for an unprogrammed page of the open block, based on at least one of the operation temperature information and the read count, and generating the command for performing the read retry operation, wherein the controller controls a count of read retry operations performed in the open block so that the count is equal to or greater than a count of read retry operations performed in the closed block.

11. An operating method of a memory system including a memory device provided with a memory cell array including a plurality of blocks each of which includes a plurality of pages; and a controller suitable for generating a command and an address to control operation of the memory device, the operating method comprising:

detecting error bits included in data read out from the memory device during a read operation of the memory device;

indicating a read fail when the number of detected error bits is greater than or equal to a correctable error bit threshold value;

determining, when the read fail occurs, whether a block in which the read fail has occurred is an open block including an unprogrammed page;

performing, if it is determined that the block in which the read fail has occurred is the open block including the unprogrammed page, a restoration operation for the unprogrammed page, based on at least one of operation temperature information and a read count; and performing a read retry operation.

12. The operating method according to claim 11, wherein the performing the restoration operation for the unprogrammed page comprises:

performing the restoration operation for the unprogrammed page when a difference between a temperature at a time at which data of a programmed page of the open block is written and a temperature at a time at which the data is read is greater than or equal to a given level.

13. The operating method according to claim 11, wherein the performing the restoration operation for the unprogrammed page comprises:

performing the restoration operation for the unprogrammed page when the read count of the open block is greater than or equal to a certain reference value.

14. The operating method according to claim 11, wherein in the case where, while program operations are performed in response to write commands that are successively inputted, the read fail occurs when the read operation is performed in response to a read command for lately programmed page data, the restoration operation is performed by programming data that is continuously inputted in response to the write commands, on the unprogrammed page of the open block.

15. The operating method according to claim 11, wherein in the case where, after program operations are completed, the read fail occurs while the read operation is performed in response to a read command, the restoration operation is performed by programming system data and data stored in a page buffer after the program operations, on the unprogrammed page of the open block.

16. The operating method according to claim 11, wherein in the case where, after power-on, the read fail occurs while the read operation is performed in response to a read command for a block on which a last program operation has been performed, the restoration operation is performed by programming dummy data on the unprogrammed page of the open block.

17. The operating method according to claim 11, further comprising:

receiving and storing, when power-on, the operation temperature information stored in a spare region of the memory cell array, open/closed block information about whether the corresponding block is a closed block in which program operations for all pages have been completed or an open block in which program operations for only some pages have been completed, and the read count.

18. The operating method according to claim 11, wherein he read retry operation comprises:

changing a read voltage level applied to the memory cell array, based on a read retry table, and performing at least one read operation.

19. An operating method of a memory system including a memory device provided with a memory cell array including a plurality of blocks each of which includes a plurality of pages; and a controller suitable for generating a command and an address to control operation of the memory device, the operating method comprising:

detecting error bits included in data read out from the memory device during a read operation of the memory device;

indicating a read fail when the number of detected error bits is greater than or equal to a correctable error bit threshold value;

performing a read retry operation when the read fail occurs;

determining whether a block in which the read fail has occurred is an open block including an unprogrammed page;

performing, if it is determined that the block in which the read fail has occurred is the open block including the unprogrammed page, a restoration operation for the unprogrammed page, based on at least one of operation temperature information and a read count; and performing a read retry operation for the open block on which the restoration operation has been performed.

* * * * *